(12) United States Patent
Kim

(10) Patent No.: US 8,451,036 B2
(45) Date of Patent: May 28, 2013

(54) PULSE SIGNAL GENERATION CIRCUIT AND METHOD FOR OPERATING THE SAME

(75) Inventor: Jung-Hyun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/205,998

(22) Filed: Aug. 9, 2011

(65) Prior Publication Data

US 2012/0154004 A1    Jun. 21, 2012

(30) Foreign Application Priority Data

Dec. 17, 2010  (KR) .................. 10-2010-0129884

(51) Int. Cl.
*H03K 5/04* (2006.01)

(52) U.S. Cl.
USPC .......................................... 327/174; 327/172

(58) Field of Classification Search
None
See application file for complete search history.

(56) References Cited

U.S. PATENT DOCUMENTS

| | | | | |
|---|---|---|---|---|
| 4,746,819 A * | 5/1988 | Kashiwagi | ................... | 327/244 |
| 6,750,685 B1 * | 6/2004 | Guerrero Mercado | ....... | 327/108 |
| 7,000,128 B1 * | 2/2006 | Broach | .......................... | 713/320 |
| 8,013,646 B2 * | 9/2011 | Millar | .......................... | 327/158 |

* cited by examiner

*Primary Examiner* — Cassandra Cox
(74) *Attorney, Agent, or Firm* — IP & T Group LLP

(57) ABSTRACT

A pulse signal generation circuit includes a transfer path configured to receives and transfer a first pulse signal, a pulse adjustment unit configured to adjust a pulse width of the first pulse signal by applying charges to the transfer path in response to a control signal, and a pulse output unit configured to output a second pulse signal of the adjusted pulse width in response to an output of the transfer path.

18 Claims, 3 Drawing Sheets

PULSE SIGNAL GENERATION CIRCUIT AND METHOD FOR OPERATING THE SAME

CROSS-REFERENCE TO RELATED APPLICATIONS

The present application claims priority of Korean Patent Application No. 10-2010-0129884, filed on Dec. 17, 2010, which is incorporated herein by reference in its entirety.

BACKGROUND

1. Field

Exemplary embodiments of the present invention relate to semiconductor design technology, and more particularly, to a pulse signal generation circuit for receiving a pulse signal of a predefined pulse width and generating a pulse signal of a desired pulse width by adjusting the pulse width.

2. Description of the Related Art

In general, semiconductor devices, such as a double data rate (DDR) synchronous DRAM (SDRAM), include a variety of internal circuits for several internal operations. Among the internal circuits, a pulse signal generation circuit generates a pulse signal of a desired pulse width. The pulse signal generated from the pulse signal generation circuit is used for sampling a clock signal during a desired period or enabling a specific circuit during a desired period.

FIG. 1 is a circuit diagram of a conventional pulse signal generation circuit.

Referring to FIG. 1, the pulse signal generation circuit includes a signal delay unit 110 and a pulse output unit 120.

The signal delay unit 110 is configured to delay an input pulse signal IN by a predefined time and includes a plurality of inverters. The signal delay unit 110 includes even number (2n) of inverters (where n is a natural number). The pulse output unit 120 outputs an output pulse signal OUT in response to an input pulse signal IN and an output signal of the signal delay unit 110.

FIG. 2 is a waveform diagram explaining the operation of the pulse signal generation circuit illustrated in FIG. 1. For illustration purposes, the input pulse signal IN having a logic-low pulse duration is taken as an example.

Referring to FIGS. 1 and 2, the input pulse signal IN is inputted to the signal delay unit 110 and the pulse output unit 120. The output pulse signal OUT changes from a logic high level to a logic low level in response to the input pulse signal IN changing from a logic high level to a logic low level. The signal delay unit 110 includes even number of inverters. A first inverter INV1 inverts and delays the input pulse signal IN and output a delayed signal D_INV1, and a second inverter INV2 inverts and delays the output signal D_INV1 of the first inverter INV1 and outputs a delayed signal D_INV2. The pulse output unit 120 generates the output pulse signal OUT in response to the input pulse signal IN and the output signal D_INV2n of the signal delay unit 110. The output pulse signal OUT changes from a logic low level to a logic high level in response to a change of the output signal D_INV2n from a logic low level to a logic high level.

Consequently, the output pulse signal OUT has a pulse width corresponding to the delay time of the signal delay unit 110.

Meanwhile, as described above with reference to FIGS. 1 and 2, the input pulse signal IN is inputted to the signal delay unit 110 and is delayed by the predefined time. At this time, the signal delay unit 110 includes a plurality of inverters INV1, INV2, . . . INV2n.

Here, the signal delay unit 110 inverts and delays the input pulse signal IN. Such an operation may cause various malfunctions such as a coupling of peripheral circuits, and consumes a relatively large amount of power. In addition, as a larger number of inverters are provided in order to further widen the pulse width of the output pulse signal OUT, the above-mentioned features become more significant and the layout size further increases. Moreover, interconnection wirings become more complicated.

SUMMARY

An embodiment of the present invention is directed to a pulse signal generation circuit for adjusting a pulse width of a first pulse signal by supplying/applying a preset amount of charges to a transfer path through which the first pulse signal is inputted.

In accordance with an embodiment of the present invention, a pulse signal generation circuit includes: a transfer path configured to receives and transfer a first pulse signal; a pulse adjustment unit configured to adjust a pulse width of the first pulse signal by applying charges to the transfer path in response to a control signal; and a pulse output unit configured to output a second pulse signal of the adjusted pulse width in response to an output of the transfer path.

In accordance with another embodiment of the present invention, a pulse signal generation circuit includes: a pulse input unit configured to receive a first pulse signal; a pulse adjustment unit configured to adjust a pulse width of an output signal of the pulse input unit by applying charges to an output terminal of the pulse input unit in response to a control signal; and a pulse output unit configured to output a second pulse signal of the adjusted pulse in response to the output signal of the pulse input unit.

In accordance with yet another embodiment of the present invention, a method for operating a pulse signal generation circuit includes: receiving a first pulse signal having first and second levels and having a pulse width; accumulating charges in response to the first pulse signal of the first level; and outputting a second pulse signal by delaying the first pulse signal due to an application of the accumulated charges at a point of time when the first pulse signal changes from the first level to the second level.

The pulse signal generation circuit in accordance with the embodiment of the present invention may adjust the pulse width of the first pulse signal by applying charges to the transfer path, through which the first pulse signal is transferred, in response to the control signal and output the signal of the adjusted pulse width as the second pulse signal.

DETAILED DESCRIPTION

Figure 1:
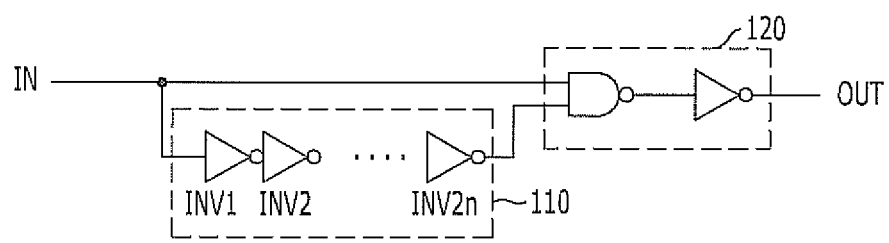
FIG. 1 is a circuit diagram of a conventional pulse signal generation circuit.
Figure 2:
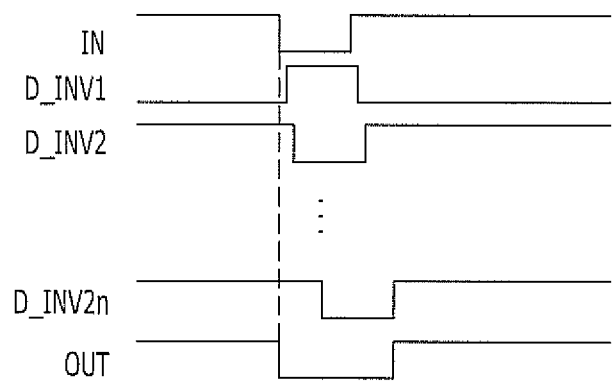
FIG. 2 is a waveform diagram explaining the operation of the pulse signal generation circuit illustrated in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
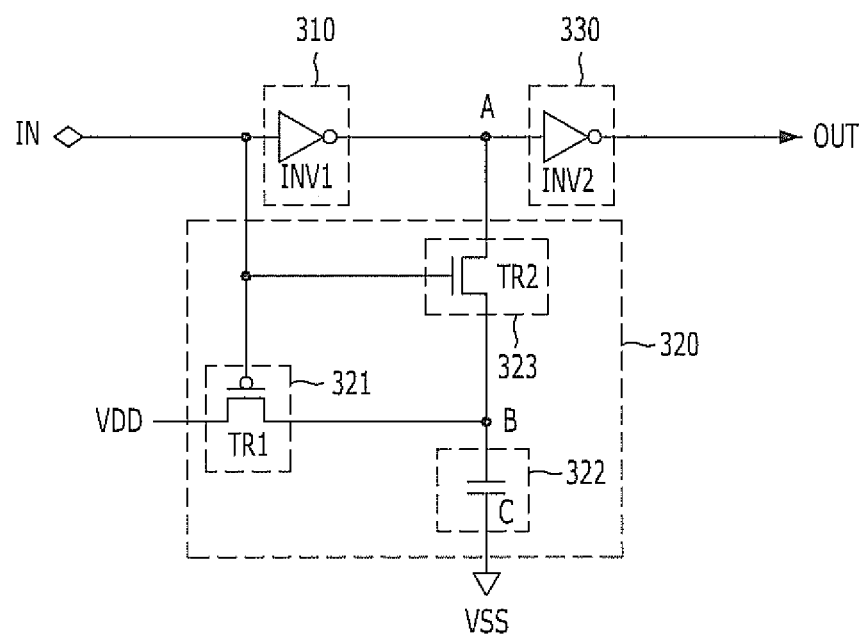
FIG. 3 is a circuit diagram of a pulse signal generation circuit in accordance with a first embodiment of the present invention.

FIG. 3 is a circuit diagram of a pulse signal generation circuit in accordance with a first embodiment of the present invention.

Referring to FIG. 3, the pulse signal generation circuit includes a pulse input unit 310, a pulse adjustment unit 320, and a pulse output unit 330.

The pulse input unit 310 is configured to receive an input pulse signal IN. The pulse input unit 310 includes a first inverter INV1 that 1.5 inverts the input pulse signal IN and outputs the inverted signal to an output terminal, i.e., a node A. The pulse signal generation circuit in accordance with the first embodiment of the present invention has a transfer path through which the input pulse signal IN is transferred. In the first embodiment, the first inverter INV1 and the output terminal thereof may be included in the transfer path.

The pulse adjustment unit 320 is configured to adjust the pulse width of the output signal of the first inverter INV1 by applying a preset amount of charges to the transfer path in response to the input pulse signal IN serving as a control signal. The pulse adjustment unit 320 includes a charge supply section 321, a charging section 322, and a charge transfer section 323.

The charge supply section 321 is configured to supply a power supply voltage VDD to the charging section 322 in response to the input pulse signal IN. The charge supply section 321 includes a first MOS transistor TR1 that forms a source-drain path between the power supply voltage (VDD) terminal and a common node, i.e., a node B, and has a gate receiving the input pulse signal IN. The charging section 322 is configured to charge the charges transferred from the charge supply section 321. The charging section 322 includes a capacitor C coupled between the node B and a ground voltage (VSS) terminal. The charge transfer section 323 is configured to transfer the charges charged in the charging section 322 to the transfer path, i.e., the node A, in response to the input pulse signal IN. The charge transfer section 323 includes a second MOS transistor TR2 that forms a source-drain path between the node A and the node B and has a gate receiving the input pulse signal IN.

Meanwhile, the pulse output unit 330 is configured to output the output pulse signal OUT in response to the signal transferred through the transfer path, i.e., the signal of the node A whose pulse width is adjusted by the pulse adjustment unit 320. The pulse output unit 330 includes a second inverter INV2 that inverts the pulse signal of the node A and outputs the output pulse signal OUT.

Figure 4:
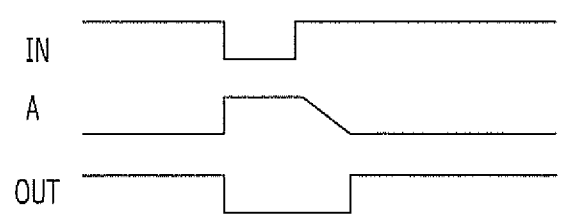
FIG. 4 is a waveform diagram explaining the operation of the pulse signal generation circuit illustrated in FIG. 3.

FIG. 4 is a waveform diagram explaining the operation of the pulse signal generation circuit illustrated in FIG. 3. For illustration purposes, the input pulse signal IN having a logic-low pulse duration is taken as an example.

Referring to FIGS. 3 and 4, the input pulse signal IN is inputted to the pulse input unit 310 and the pulse adjustment unit 320. At the point of time when the input pulse signal IN changes from a logic high level to a logic low level, the signal of the node A changes from a logic low level to a logic high level. At the same time, the charge supply section 321 is enabled to supply the power supply voltage VDD to the charging section 322, and the charge transfer section 323 is disabled.

That is, the first MOS transistor TR1 is turned on in response to the input pulse signal IN, and the power supply voltage VDD is supplied to the capacitor C. The second MOS transistor TR2 is turned off in response to the input pulse signal IN.

At the point of time when the input pulse signal IN changes from a logic low level to a logic high level, the charge transfer section 323 is enabled to transfer the charges charged in the charging section 322 to the node A, and the charge supply section 321 is disabled. That is, the second MOS transistor TR2 is turned on in response to the input pulse signal IN, and the charges charged in the capacitor C are transferred to the node A. The first MOS transistor TR1 is turned off in response to the input pulse signal IN. Therefore, the node A is coupled to the capacitor C, and the signal of node A changes to a logic low level after a time corresponding to an amount of the charges charged in the capacitor C.

In other words, the output pulse signal OUT changes from a logic high level to a logic low level at the point of time when the input pulse signal IN changes to a logic low level. When the input pulse signal IN changes to a logic high level, the output pulse signal OUT changes from a logic low level to a logic high level after a time corresponding to an amount of the charges charged in the capacitor C.

Figure 5:
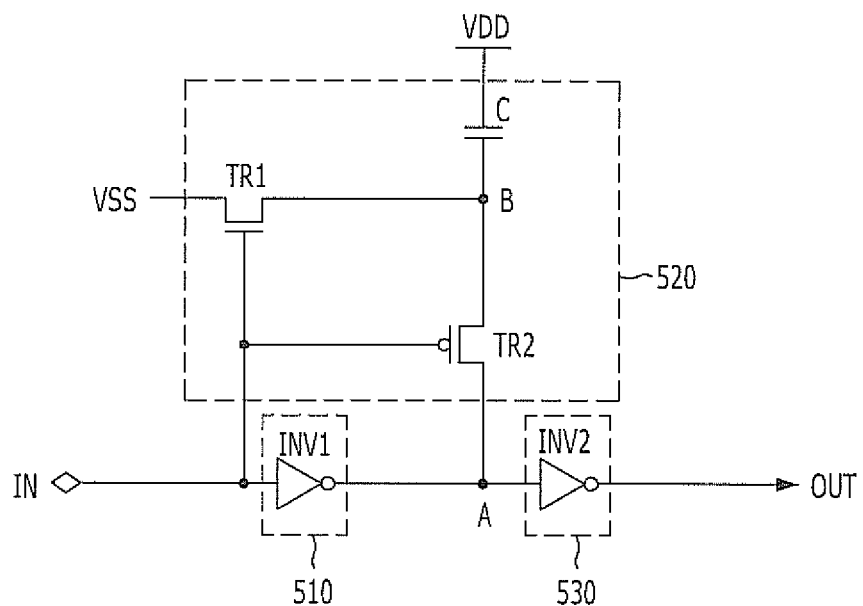
FIG. 5 is a circuit diagram of a pulse signal generation circuit in accordance with a second embodiment of the present invention.

FIG. 5 is a circuit diagram of a pulse signal generation circuit in accordance with a second embodiment of the present invention.

Referring to FIG. 5, the pulse signal generation circuit includes a pulse input unit 510, a pulse adjustment unit 520, and a pulse output unit 530. The second embodiment is different from the first embodiment in the configuration of the pulse adjustment unit 520. For illustration purposes, detailed descriptions as to the circuitry of the pulse input unit 510 and the pulse output unit 530 will be omitted.

The pulse adjustment unit 520 includes a first MOS transistor TR1, a capacitor C, and a second MOS transistor TR2. The first MOS transistor TR1 forms a source-drain path between a ground voltage (VSS) terminal and a common node, i.e., a node B, and has a gate receiving an input pulse signal IN. The capacitor C is coupled between the node B and a power supply voltage (VDD) terminal. The second MOS transistor TR2 forms a source-drain path between a node A and the node B and has a gate receiving the input pulse signal IN.

Figure 6:
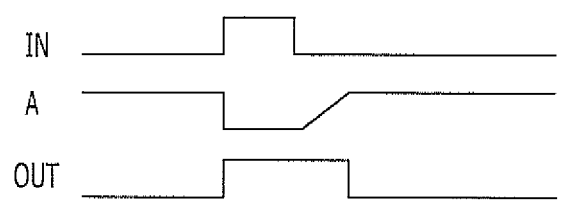
FIG. 6 is a waveform diagram explaining the operation of the pulse signal generation circuit illustrated in FIG. 5.

FIG. 6 is a waveform diagram explaining the operation of the pulse signal generation circuit illustrated in FIG. 5. For illustration purposes, the input pulse signal IN having a logic-high pulse duration is taken as an example.

Referring to FIGS. 5 and 6, the input pulse signal IN is inputted to the pulse input unit 510 and the pulse adjustment unit 520. At the point of time when the input pulse signal IN changes from a logic low level to a logic high level, the signal of the node A changes from a logic high level to a logic low level. At the same time, the first MOS transistor TR1 is turned on in response to the input pulse signal IN, and the ground voltage VSS is supplied to the capacitor C. The second MOS transistor TR2 is turned off in response to the input pulse signal IN.

At the point of time when the input pulse signal IN changes from a logic high level to a logic low level, the second MOS transistor TR2 is turned on in response to the input pulse signal IN, and the charges charged in the capacitor C are transferred to the node A. The first MOS transistor TR1 is turned off in response to the input pulse signal IN. Therefore, the node A is coupled to the capacitor C, and the signal of the node A changes to a logic high level after a time corresponding to an amount of the charges charged in the capacitor C.

In other words, the output pulse signal OUT changes from a logic low level to a logic high level at the point of time when the input pulse signal IN changes to a logic high level. When the input pulse signal IN changes to a logic low level, the output pulse signal OUT changes from a logic high level to a logic low level after a time corresponding to an amount of the charges charged in the capacitor C.

As described above, in accordance with the first and second embodiments of the present invention, the pulse signal generation circuit may generate the output pulse signal OUT having the pulse width corresponding to the amount of charges charged in the capacitor C. Therefore, when the pulse width is to be adjusted, the capacity of the capacitor C may be designed/adjusted accordingly. Consequently, the layout of the pulse signal generation circuit may be minimized.

While the present invention has been described with respect to the specific embodiments, it will be apparent to those skilled in the art that various changes and modifications may be made without departing from the spirit and scope of the invention as defined in the following claims.

For example, while the input pulse signal IN is used as the control signal in the above embodiments, the present invention may also be applied to the use of the output pulse signal as the control signal.

The positions and types of the logic gates and transistors set forth above may be changed depending on the polarities of the input signals.

What is claimed is:

1. A pulse signal generation circuit comprising:
   a transfer path configured to receive and transfer a first pulse signal;
   a pulse adjustment unit configured to adjust a pulse width of the first pulse signal by applying charges to the transfer path in response to a control signal; and
   a pulse output unit configured to output a second pulse signal of the adjusted pulse width in response to an output of the transfer path,
   wherein the control signal comprises the first pulse signal or the second pulse signal.

2. The pulse signal generation circuit of claim 1, wherein the control signal is activated in response to a deactivation of the first pulse signal.

3. The pulse signal generation circuit of claim 1, wherein the pulse adjustment unit comprises:
   a charge supply section configured to supply a power supply voltage in response to the control signal;
   a charging section configured to accumulate charges supplied by the power supply voltage of the charge supply section; and
   a charge transfer section configured to transfer the accumulated charges in the charging section to the transfer path in response to the control signal.

4. The pulse signal generation circuit of claim 3, wherein the charge transfer section is deactivated in a period in which the charge supply section supplies the power supply voltage to the charging section.

5. The pulse signal generation circuit of claim 3, wherein the charge supply section is deactivated in a period in which the charge transfer section transfers the charges to the transfer path.

6. The pulse signal generation circuit of claim 1, wherein the second pulse signal is outputted by delaying one of rising and falling transitions of the first pulse signal by a time corresponding to the preset amount of the charges.

7. A pulse signal generation circuit comprising:
   a pulse input unit configured to receive a first pulse signal;
   a pulse adjustment unit configured to adjust a pulse width of an output signal of the pulse input unit by applying charges to an output terminal of the pulse input unit in response to a control signal; and
   a pulse output unit configured to output a second pulse signal of the adjusted pulse in response to the output signal of the pulse input unit,
   wherein the control signal comprises the first pulse signal or the second pulse signal.

8. The pulse signal generation circuit of claim 7, wherein the second pulse signal is outputted by delaying one of rising and falling transitions of the first pulse signal by a time corresponding to the preset amount of the charges.

9. The pulse signal generation circuit of claim 7, wherein the pulse adjustment unit comprises:
   a charge supply section configured to supply a power supply voltage in response to the control signal;
   a charging section configured to accumulate charges supplied by the power supply voltage of the charge supply section; and
   a charge transfer section configured to transfer the accumulated charges in the charging section to the transfer path in response to the control signal.

10. The pulse signal generation circuit of claim 9, wherein the charge supply section comprises a first MOS transistor coupled between a first power supply voltage terminal and a common node and configured to receive the first pulse signal through a gate thereof.

11. The pulse signal generation circuit of claim 10, wherein the charge transfer comprises a second MOS transistor coupled between the output terminal of the pulse input unit and the common node and configured to receive the first pulse signal through a gate thereof.

12. The pulse signal generation circuit of claim 11, wherein the charging section comprises a capacitor coupled between the common node and a second power supply voltage terminal.

13. The pulse signal generation circuit of claim 12, wherein the first power supply voltage terminal receives the power supply voltage and the second power supply voltage terminal receives a ground voltage.

14. The pulse signal generation circuit of claim 12, wherein the first power supply voltage terminal receives a ground voltage and the second power supply voltage terminal receives the power supply voltage.

15. A method for operating a pulse signal generation circuit, comprising:
   receiving a first pulse signal having first and second levels and having a pulse width;
   accumulating charges in response to the first pulse signal of the first level; and
   outputting a second pulse signal by delaying the first pulse signal due to an application of the accumulated charges at a point of time that the first pulse signal changes from the first level to the second level.

16. The method of claim 15, wherein the level of the second pulse signal changes after a time corresponding to the amount of the charged charges from the change of the first pulse signal from the first level to the second level.

17. The method of claim 15, wherein the outputting of the second pulse signal comprises:

applying the accumulated charges in delaying the first pulse signal in response to the first pulse signal of the second level.

18. The method of claim 17, wherein the accumulating of the charges and the applying of the charged charges are performed in different operation periods, respectively.

* * * * *